(12) United States Patent
Peng

(10) Patent No.: US 6,176,252 B1
(45) Date of Patent: Jan. 23, 2001

(54) APPARATUS FOR SUPPLYING LIQUID IN SEMICONDUCTOR MANUFACTURING PROCESS

(75) Inventor: Jui-Hung Peng, Hsinchu (TW)

(73) Assignee: Winbond Electronics Corp., Hsinchu (TW)

(*) Notice: Under 35 U.S.C. 154(b), the term of this patent shall be extended for 0 days.

(21) Appl. No.: 09/370,513

(22) Filed: Aug. 6, 1999

(30) Foreign Application Priority Data

Mar. 17, 1999 (TW) .................................................. 88104175

(51) Int. Cl.[7] ........................................................ F04F 1/14
(52) U.S. Cl. ............................. 137/209; 95/262; 96/219; 96/220
(58) Field of Search .................................. 95/262; 96/207, 96/215, 219, 220; 137/171, 209

(56) References Cited

U.S. PATENT DOCUMENTS

| | | | | |
|---|---|---|---|---|
| 5,814,151 | * | 9/1998 | Lee et al. | 137/209 X |
| 5,871,028 | * | 2/1999 | Liu | 137/209 |
| 6,014,995 | * | 1/2000 | Agnew | 137/209 X |
| 6,021,921 | * | 2/2000 | Lan et al. | 137/209 X |

* cited by examiner

Primary Examiner—Gerald A. Michalsky
(74) Attorney, Agent, or Firm—Allen, Dyer, Doppelt, Milbrath & Gilchrist, P.A.

(57) ABSTRACT

An apparatus for supplying a liquid in a semiconductor manufacturing process includes a container storing the liquid therein, and having a gas inlet for introducing a gas and a liquid outlet for discharging the liquid pressurized by the gas, and a first filter connected to the liquid outlet of the container for removing an impurity of the liquid. The container is slopingly positioned so that the liquid outlet of the container is inclined downwardly to allow the liquid to be totally discharged therefrom. The first filter includes a plurality of plates extending outwardly form an inner surface of the first filter for allowing the liquid to be agitated therein, an outlet arranged at the bottom of the first filter for discharging a precipitated impurity, and a plurality of exhaust valves respectively arranged adjacent to the plates for allowing a gaseous impurity to be released therefrom. The apparatus further includes a second filter connected to the first filter for filtering out a residual impurity of the liquid.

15 Claims, 2 Drawing Sheets

APPARATUS FOR SUPPLYING LIQUID IN SEMICONDUCTOR MANUFACTURING PROCESS

FIELD OF THE INVENTION

The present invention relates to an apparatus for supplying a liquid, and more particularly to an apparatus for supplying a photoresist liquid in a semiconductor manufacturing process.

BACKGROUND OF THE INVENTION

In the semiconductor manufacturing process, a layer of the photoresist liquid is coated on a wafer by a spin-coater before a photolithographic process. Because the demand for the semiconductor device is severe, the yield of the wafer may be reduced if there is an impurity remained on the wafer. That is, if any particle or bubble is retained in the photoresist liquid, then the quality of the wafer may be reduced. Therefore, the impurities of the photoresist liquid must be removed before that the liquid is applied on the surface of the wafer.

Please refer to FIG. 1 which is a diagram showing the apparatus for supplying the photoresist liquid of the prior art. The conventional apparatus includes a container 12 filled with the photoresist liquid 11 and a filter 15. The container 12 is placed straight in a hermetic receiver 13. A pipe 14 is inserted into the container 12 and connected to the filter 15. A nitrogen gas ($N_2$) is introduced into the receiver 13 through a valve 16. After the gas enters the receiver 13, the photoresist liquid 11 is discharged from the container 12 because of the pressurization 17 of the nitrogen gas. The photoresist liquid 11 enters the filter 15 through the pipe 14. The impurities of the photoresist liquid, including particles and bubbles, are removed by the filter 15. Finally, the photoresist liquid 11 is introduced into the spin-coater and then coated on the wafer.

However, there are two shortcomings of the apparatus for supplying the photoresist liquid in the prior art. First, there is a recess at the bottom 18 of the container 12 so the bottom surface of the container is uneven. If the pipe 14 is short and can not be inserted into the recess, there will be a distance between the pipe 14 and the bottom 18 of the container 12. Therefore, the photoresist liquid in the recess can not be discharged from the container 12, and a lot of photoresist liquid 11 will be retained in the container 12. On the contrary, if the pipe 14 is long enough to reach the bottom 18 of the container 12, the photoresist liquid 11 may not be discharged easily. That will waste a lot of photoresist liquid.

Second, all kinds of impurities must be removed by the filter 15. The only one filter may be exchanged frequently and the cost of the semiconductor chip will be increased. Therefore, it is tried by the applicant to deal with the problems encountered with the prior art.

SUMMARY OF THE INVENTION

A major object of the present invention is to provide an apparatus for supplying the photoresist liquid in the semiconductor manufacturing process.

Another object of the present invention is to provide a kind of placement of a container filled with the photoresist liquid for allowing the photoresist liquid to be totally discharged from the container.

Another object of the present invention is to provide an apparatus for removing the impurities of the photoresist liquid.

The improvements made in the present invention includes the placement of the container filled with the photoresist liquid and the filters.

According to tile present invention, the apparatus for supplying a liquid in a semiconductor manaufacturing process includes a container storing the liquid therein and a gas inlet for introducing a gas and a liquid outlet for discharging the liquid pressurized by the gas. The apparatus further includes a first filter connected to the liquid outlet of the container for removing an impurity of the liquid.

The container is slopingly positioned so that the liquid outlet of the container is inclined downwardly to allow the liquid to be totally discharged therefrom. The liquid is a photoresist liquid and the gas is a chemically inert gas. Certainly, the gas is nitrogen ($N_2$) gas. The impurity of the liquid contains a particle and a bubble.

The first filter includes a plurality of plates extending outwardly from an inner surface of the first filter for allowing the liquid to be agitated therein, an outlet arranged at the bottom of the first filter for discharging a precipitated impurity, and a plurality of exhaust valves respectively arranged adjacent to the plates for allowing a gaseous impurity to be released from the first filter.

The apparatus further includes a second filter connected to the first filter for filtering out a residual impurity of the liquid.

The present invention may best be understood through the following description with reference to the accompanying drawings, in which:

DETAILED DESCRIPTION OF THE PREFERRED EMBODIMENTS

Figure 1:
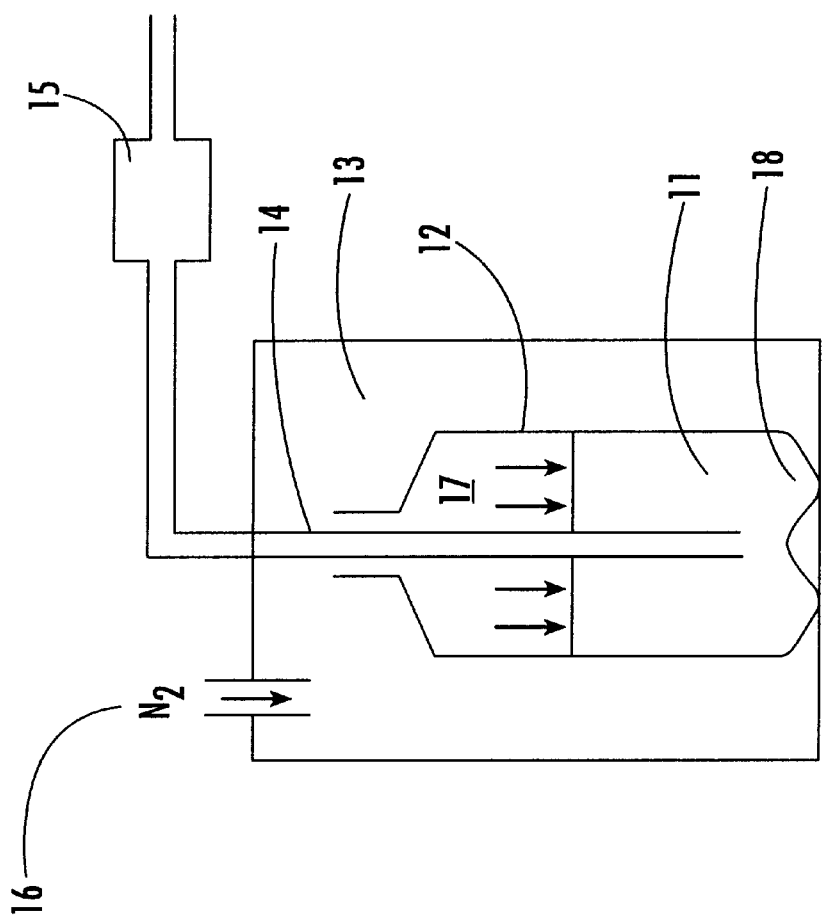
FIG. 1 is a schematic diagram showing the apparatus for supplying a photoresist liquid of the prior art.
Figure 2:
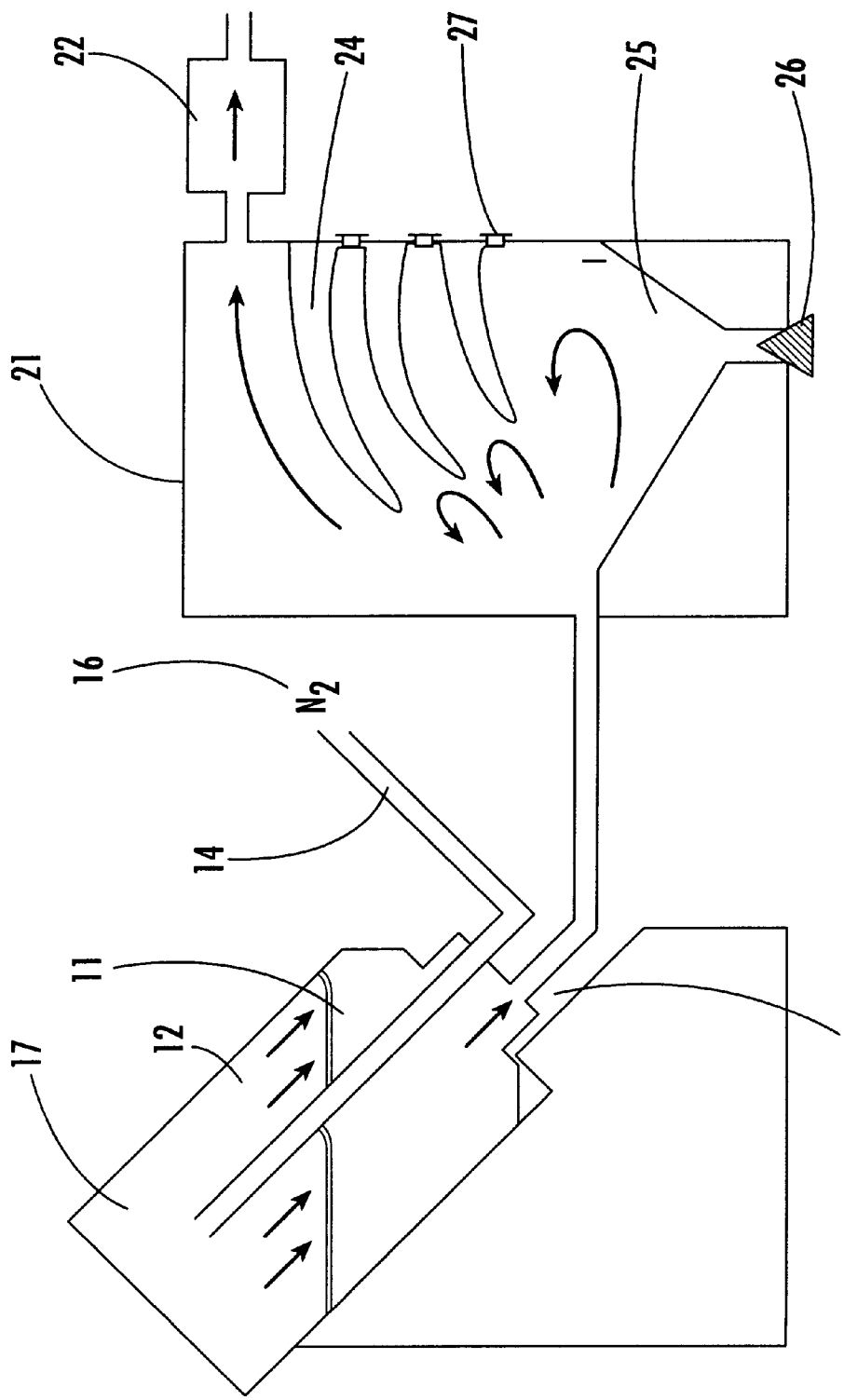
FIG. 2 is a schematic diagram showing apparatus for supplying a photoresist liquid according to the present invention.

Please refer to FIG. 2 which is a diagram showing the detailed structure of the apparatus for supplying the photoresist liquid of the present invention. The apparatus includes a container 12 storing the photoresist liquid 11, a first filter 21, and a second filter 22. The impurities of the photoresist liquid, such as particles and bubbles, should be removed so that the sequential manufacturing process will not be influenced by them.

The container 12 has a liquid outlet 23 for discharging the photoresist liquid 11. Besides, a pipe 14 is inserted into the container 12 for introducing a nitrogen gas ($N_2$). The container is slopingly positioned, so that the photoresist liquid flows to the front space of the container and the pipe 14 is inserted into the bottom space of the container without photoresist liquid 11. After the nitrogen gas is introduced into the container 12 through the pipe 14, the photoresist liquid is pressurized by the nitrogen gas and discharged from the container 12 very easily. Preferably, the liquid outlet 23 is positioned at the lowest point in respect of the container 12. Therefore, all the photoresist liquid can be discharged from the container 12. The nitrogen gas can be replaced by any kind of chemically inert gas.

The first filter 21 is connected with the liquid outlet 23 of the container 12. The photoresist liquid discharged from the container flows to the first filter 21 for filtering out the impurities of the photoresist liquid. The impurities of the photoresist liquid contain particles and bubbles. The first filter 21 has a plurality of plates 24 extending outwardly from an inner surface of the first filter for allowing the photoresist liquid to be agitated therein. The particles in the photoresist liquid will be precipitated at the bottom 25 of the first filter when the photoresist liquid is agitated therein. The precipitated particles can be discharged form an outlet 26 at the bottom of the first filter. The first filter further includes a plurality of exhaust valves 27 respectively arranged adjacent the plates 24 for allowing the bubbles in the photoresist liquid to be released therefrom.

Before applying on a wafer, the photoresist liquid is introduced into the second filter 22 for removing the residual impurities of the photoresist liquid 11. Most of the impurities can be removed by the first filter, and thus, the original filter (the second filter) can be used for a longer time. Finally, the photoresist liquid 11 is introduced to a spin-coater and then applied on the surface of the wafer.

According to the present invention, the advantages of the apparatus for supplying the photoresist liquid include: (1) The container filled with the photoresist liquid is slopingly positioned so that the liquid outlet of the container is inclined downwardly to allow the photoresist liquid to be totally discharged therefrom. Therefore, all of the photoresist liquid can be used and it will not cause a waste of the photoresist liquid; (2) Most of the impurities in the photoresist liquid can be removed by the first filter and the second filter. The first filter includes an outlet for discharging the precipitated impurity and several exhaust valves for allowing the gaseous impurity to be released therefrom. All of the impurities removed by the first filter can be discharged therefrom so that the first filter can be used again and again. Therefore, the second filter for filtering out the residual impurity can also be used for a longer time. The cost for the manufacturing process of the wafer can also be reduced.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An apparatus for supplying a liquid in a semiconductor manufacturing process, the apparatus comprising:
    a container storing said liquid therein, having a gas inlet for introducing a gas, and having a liquid outlet for discharging said liquid pressurized by said gas; and
    a first filter connected to said outlet of said container for removing an impurity of said liquid, wherein said first filter comprises an outlet arranged at the bottom of said first filter for discharging a precipitated impurity.

2. The apparatus according to claim 1 wherein said liquid is a photoresist liquid.

3. The apparatus according to claim 2 wherein said gas is nitrogen (N$_2$) gas.

4. The apparatus according to claim 1 wherein said gas is a chemically inert gas.

5. The apparatus according to claim 1 wherein said container is slopingly positioned so that said outlet of said container is inclined downwardly to allow said liquid to be totally discharged therefrom.

6. The apparatus according to claim 1 wherein said first filter further comprises:
    a plurality of plates extending outwardly from an inner surface of said first filter for allowing said liquid to be agitated therein; and
    a plurality of exhaust valves respectively arranged adjacent to said plates for allowing a gaseous impurity to be released therefrom.

7. The apparatus according to claim 1 wherein said impurity of said liquid includes a particle and a bubble.

8. The apparatus according to claim 1, further comprising a second filter connected to said first filter for filtering out a residual impurity of said liquid.

9. An apparatus for supplying a liquid in a semiconductor manufacturing process, the apparatus comprising:
    a container storing a liquid therein, and having a gas inlet for introducing a gas and a liquid outlet for discharging said liquid pressurized by said gas;
    a first filter connected to said outlet of said container for removing an impurity of said liquid, said first filter including a plurality of plates extending outwardly from an inner surface thereof for allowing said liquid to be agitated therein, an outlet arranged at the bottom thereof for discharging a precipitated impurity, and a plurality of exhaust valves respectively arranged adjacent to said plates for allowing a gaseous impurity to be released therefrom.

10. The apparatus according to claim 9, further comprising a second filter connected to said first filter for filtering out a residual impurity of said liquid.

11. The apparatus according to claim 9 wherein said liquid is a photoresist liquid.

12. The apparatus according to claim 9 wherein said gas is a chemically inert gas.

13. The apparatus according to claim 9, wherein said container is slopingly positioned so that said liquid outlet of said container is inclined downwardly to allow said liquid to be totally discharged from said container.

14. An apparatus for supplying a liquid in a semiconductor manufacturing process comprising:
    a container storing said liquid therein, having a gas inlet for introducing a gas, and having a liquid outlet for discharging said liquid pressurized by said gas; and
    a first filter connected to said liquid outlet of said container for removing an impurity of said liquid, and including a plurality of plates extending outwardly from an inner surface of said first filter for allowing said liquid to be agitated therein, an outlet arranged at the bottom of said first filter for discharging a precipitated impurity, and a plurality of exhaust valves respectively arranged adjacent to said plates for allowing a gaseous impurity to be released therefrom; and
    a second filter connected to said first filter for filtering out a residual impurity of said liquid.

15. The apparatus according to claim 14 wherein said liquid is a photoresist liquid.

* * * * *